(12) United States Patent
Hori et al.

(10) Patent No.: US 11,923,224 B2
(45) Date of Patent: Mar. 5, 2024

(54) CARRIER POSITIONING MEMBER AND CARRIER PLACEMENT PLATFORM

(71) Applicant: Mitsubishi Electric Corporation, Tokyo (JP)

(72) Inventors: Koichiro Hori, Tokyo (JP); Toru Kosaki, Tokyo (JP); Wataru Yamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 665 days.

(21) Appl. No.: 17/257,713

(22) PCT Filed: Sep. 6, 2018

(86) PCT No.: PCT/JP2018/032964
§ 371 (c)(1),
(2) Date: Jan. 4, 2021

(87) PCT Pub. No.: WO2020/049671
PCT Pub. Date: Mar. 12, 2020

(65) Prior Publication Data
US 2021/0175097 A1   Jun. 10, 2021

(51) Int. Cl.
*H01L 21/673* (2006.01)
*H01L 21/68* (2006.01)

(52) U.S. Cl.
CPC .......... *H01L 21/6732* (2013.01); *H01L 21/68* (2013.01)

(58) Field of Classification Search
CPC ........................... H01L 21/6732; H01L 21/68
See application file for complete search history.

(56) References Cited

U.S. PATENT DOCUMENTS

| 6,432,849 B1 | 8/2002 | Endo et al. |
| 8,365,919 B2* | 2/2013 | Nakayama ........ H01L 21/67383 206/711 |
| 11,658,053 B2* | 5/2023 | Raga-Barone .... H01L 21/67379 269/303 |

(Continued)

FOREIGN PATENT DOCUMENTS

| CN | 106624903 A | 5/2017 |
| JP | H07-010943 U | 2/1995 |

(Continued)

OTHER PUBLICATIONS

International Search Report issued in PCT/JP2018/032964; dated Nov. 27, 2018.

(Continued)

*Primary Examiner* — Anita M King
(74) *Attorney, Agent, or Firm* — Studebaker & Brackett PC

(57) ABSTRACT

A positioning member is a carrier positioning member that is fixed to a base and that positions, on the base, a carrier storing a plurality of plate-shaped loads such that front faces or rear faces thereof face the base. The positioning member comprises two front-side stoppers that come into contact with two opening edge parts being end parts of an opening in the carrier, and restrict movement of the carrier to a front side, and two rear-side stoppers that come into contact with two plate-shaped end parts formed on a rear side in the carrier, and restrict movement of the carrier to the rear side and movement in a direction vertical to the base.

20 Claims, 10 Drawing Sheets

(56) References Cited

U.S. PATENT DOCUMENTS

2003/0029765 A1\* 2/2003 Bhatt ................ B29C 45/14311
                                                            211/41.18

FOREIGN PATENT DOCUMENTS

| JP | H9-148423 A | 6/1997 |
|----|----|----|
| JP | H10-144755 A | 5/1998 |
| JP | 2000-223553 A | 8/2000 |
| JP | 2002-093877 A | 3/2002 |
| WO | 99/040623 A1 | 8/1999 |
| WO | 2016/189579 A1 | 12/2016 |

OTHER PUBLICATIONS

An Office Action mailed by China National Intellectual Property Administration dated Oct. 11, 2023, which corresponds to Chinese Patent Application No. 201880096988.2 and is related to U.S. Appl. No. 17/257,713; with English language translation.

\* cited by examiner

CARRIER POSITIONING MEMBER AND CARRIER PLACEMENT PLATFORM

TECHNICAL FIELD

The present application relates to a carrier positioning member for positioning a carrier that stores a plate-shaped load on a base, and a carrier placement platform for placing the carrier.

BACKGROUND ART

When semiconductor elements are formed on a semiconductor wafer (semiconductor substrate), several 100 process steps are taken. In transporting and storing a semiconductor wafer between processes in the middle of forming semiconductor elements, a carrier for storing the semiconductor wafer in each of a plurality of grooves formed inside is often used. Many processing apparatuses for forming semiconductor elements on a semiconductor wafer are single-wafer processing apparatuses for processing semiconductor wafers one by one. In a single-wafer processing apparatus, a carrier is placed on a loader including a base such that semiconductor wafers are kept horizontal, the semiconductor wafers to be processed are taken out one by one from a groove of the carrier by a robot arm or the like, and processed semiconductor wafers are stored in the carrier.

For example, Patent Document 1 discloses a placement apparatus that corresponds to a placement platform having a base on which a cassette (carrier) for stacking and storing semiconductor wafers in multiple stages is positioned and placed. When a semiconductor wafer is taken in and out from the cassette, it is necessary to place the cassette at a fixed position (set position). Therefore, support members for positioning the cassette are provided in the placement apparatus of a substrate loading/unloading unit corresponding to a loader. The cassette is placed at the set position of the placement platform such that the horizontal positions of front-side corner parts, rear-side foot parts, and side faces of the cassette are restricted by six guide members (positioning members) in the support members installed on the base.

Other methods of placing the carrier in the set position of the base of the placement platform include a method of placing the carrier in the set position of the base of the placement platform by a positioning block (guide member) that is provided on the lower side of the carrier and in which a groove for fitting a bar or the like is formed (refer to Patent Document 2), a method of placing the carrier in the set position of the base of the placement platform by engaging a pin or the like (guide member) formed on the base of the placement platform with a kinematic coupling provided on the lower side of the carrier (refer to Patent Document 3.), and the like. In any method of placing the carrier on the set position of the base of the placement platform, the carrier is fitted to the guide member from the upper side when the carrier is placed on the base of the placement platform, and the carrier is moved upward to be pulled out from the guide member when the carrier is moved from the base of the placement platform.

CITATION LIST

Patent Document

Patent Document 1: Japanese Patent Application Laid-open No. H09-148423 (FIGS. 1 and 2)

Patent Document 2: Japanese Patent Application Laid-open No. 2002-93877 (FIG. 3)

Patent Document 3: Japanese Patent Application Laid-open No. 2000-223553 (FIG. 3)

SUMMARY OF INVENTION

Problems to be Solved by Invention

On a side for taking in and out a semiconductor wafer being an example of a plate-shaped load, the carrier has a structure in which the semiconductor wafer can be taken out as it is. Therefore, in the placement platform on which the carrier is placed with the semiconductor wafer kept horizontal, when the carrier is placed on the base or when the carrier is moved from the base, a problem arises in that the carrier is tilted by mistake to the side where the semiconductor wafer is taken in and out and the semiconductor wafer slips off from the carrier.

An object of the technology disclosed in the specification of the present application is to obtain a carrier positioning member that prevents a plate-shaped load such as a semiconductor wafer from slipping off from the carrier when the carrier is placed on a base or when the carrier is moved from the base.

Means for Solving Problems

An example of a carrier positioning member disclosed in the specification of the present application is a carrier positioning member that is fixed to a base and that positions, on the base, a carrier storing a plurality of plate-shaped loads such that front faces or rear faces thereof face the base. A side in an opening of the carrier in which the plate-shaped loads are taken in and out is a front side, and a side opposite to the opening of the carrier is a rear side. The carrier positioning member comprises two front-side stoppers that come into contact with two opening edge parts being end parts of the opening of the carrier to restrict movement of the carrier to the front side, and two rear-side stoppers that come into contact with two plate-shaped end parts formed on the rear side of the carrier to restrict movement of the carrier to the rear side and movement in a direction vertical to the base.

Effect of Invention

In an example of the carrier positioning member disclosed in the specification of the present application, since the two front-side stoppers restrict movement of the carrier to the front side and the two rear-side stoppers restrict movement of the carrier to the rear side and movement of the carrier in the direction vertical to the base when the carrier is placed on the base on which the carrier positioning member is fixed or when the carrier is moved from the base on which the carrier positioning member is fixed, the plate-shaped loads can be prevented from slipping off from the carrier.

MODES FOR CARRYING OUT INVENTION

Embodiment 1

Figure 1:
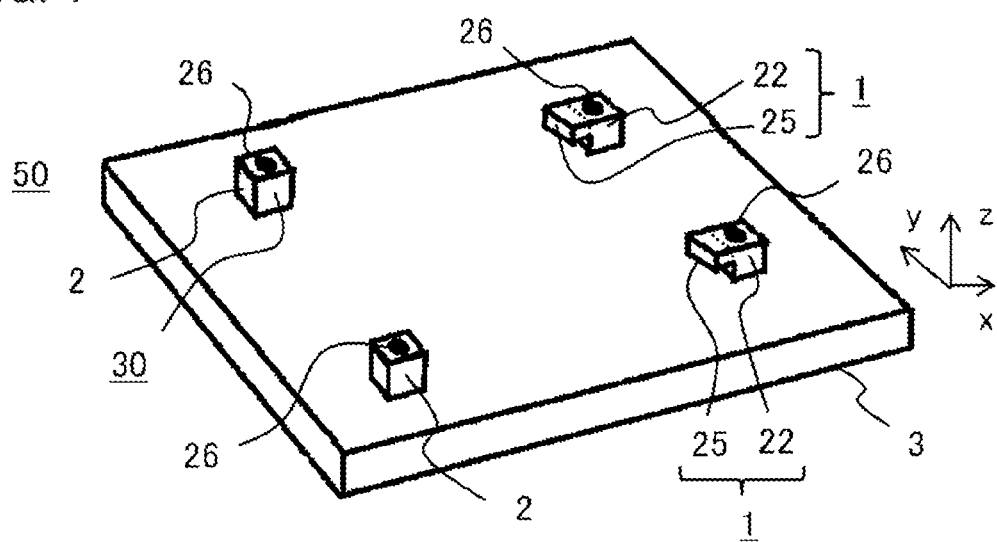
FIG. 1 is a diagram showing a positioning member and a carrier placement platform according to Embodiment 1.
Figure 2:
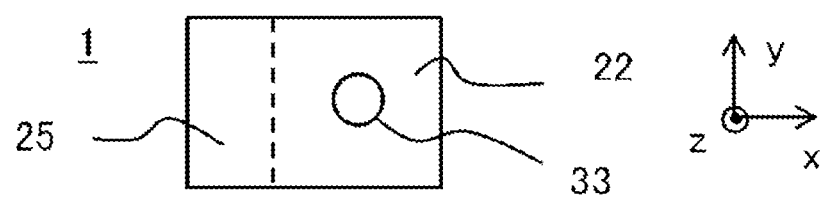
FIG. 2 is a plan view of a rear-side stopper of FIG. 1.
Figure 3:
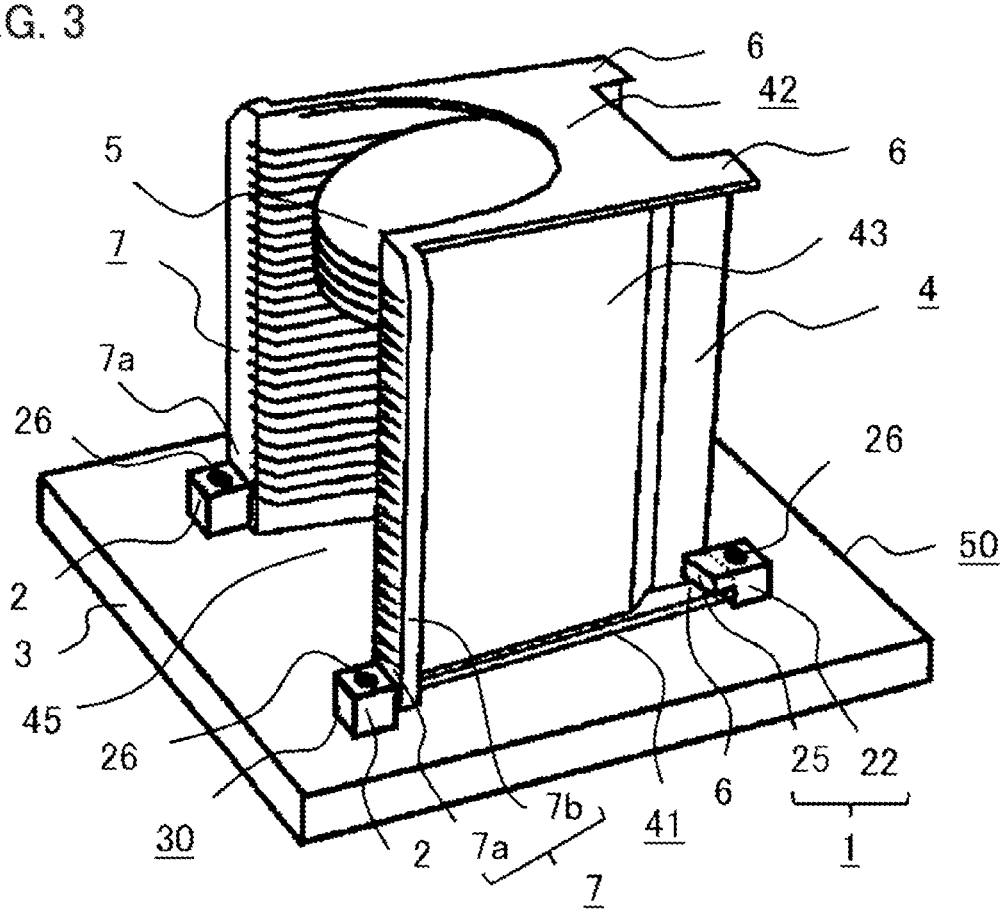
FIG. 3 is a diagram showing the carrier placement platform of FIG. 1 and a carrier.
Figure 4:
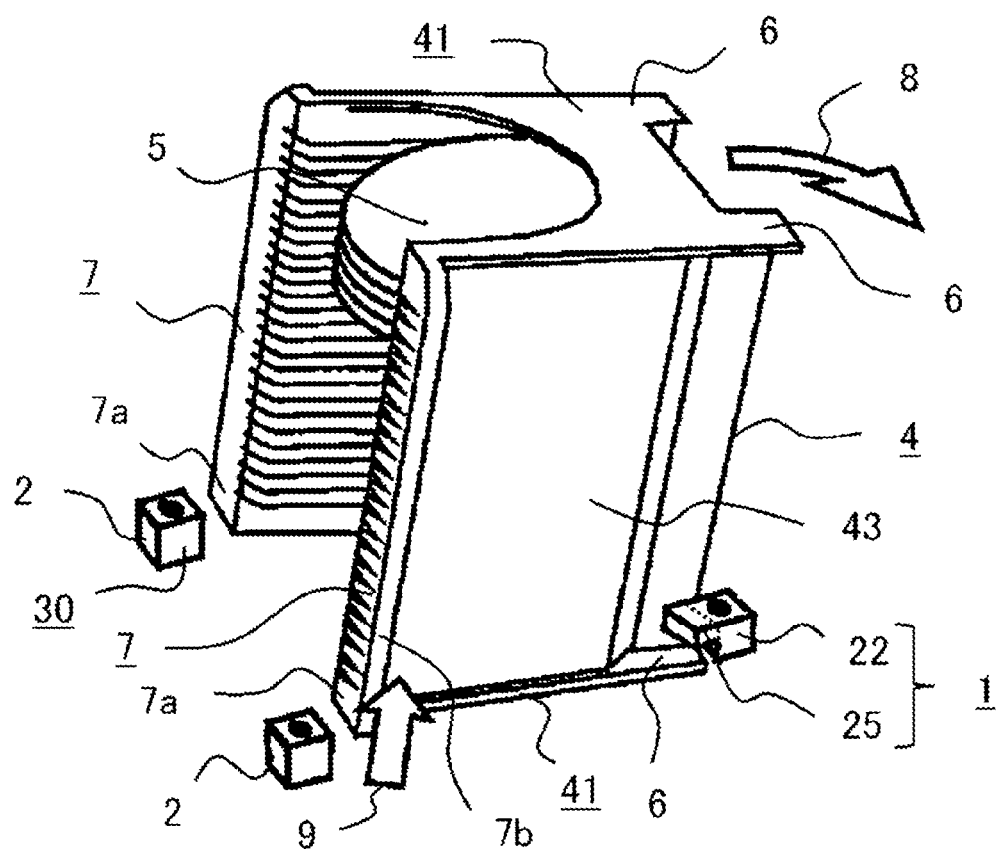
FIG. 4 is a diagram for explaining a method of moving the carrier from the carrier placement platform of FIG. 1.
Figure 5:
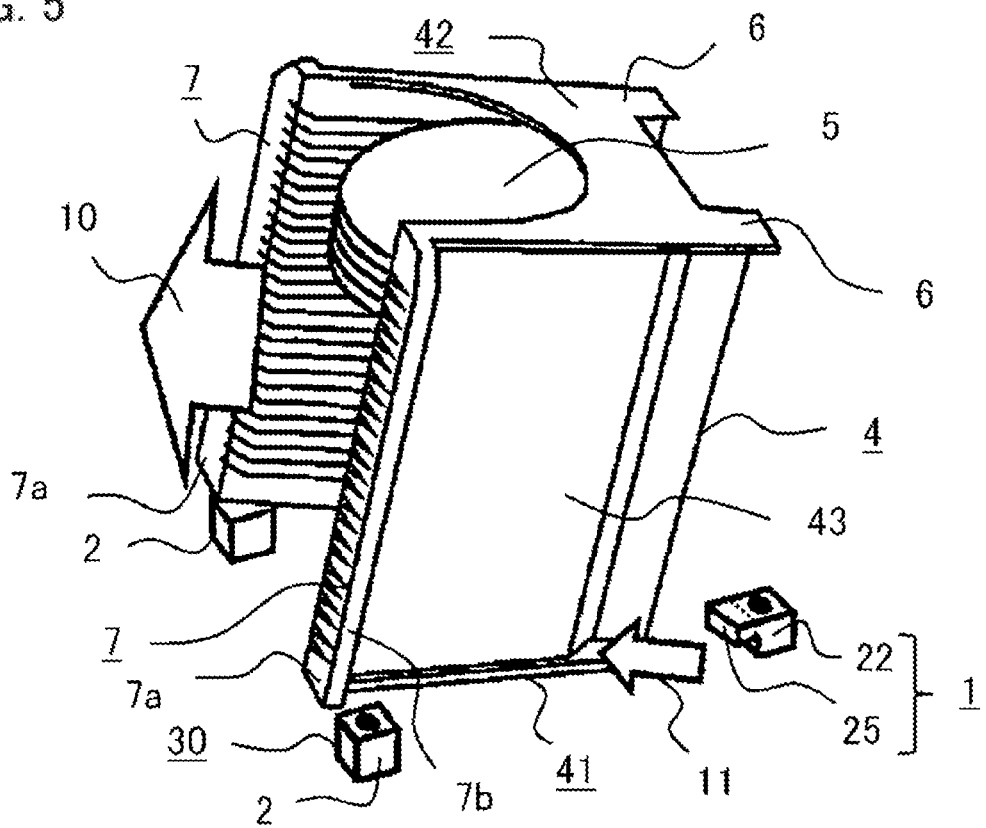
FIG. 5 is a diagram for explaining a method of moving the carrier from the carrier placement platform of FIG. 1.

FIG. 1 is a diagram showing a positioning member and a carrier placement platform according to Embodiment 1. FIG. 2 is a plan view of a rear-side stopper of FIG. 1, and FIG. 3 is a diagram showing the carrier placement platform of FIG. 1 and a carrier. FIGS. 4 and 5 each are a diagram for explaining a method of moving the carrier from the carrier placement platform of FIG. 1. The carrier placement platform 50 includes a base 3 and the positioning member 30. The positioning member 30 includes two rear-side stoppers 1 and two front-side stoppers 2. The rear-side stoppers 1 restrict foot parts 6 so that the carrier 4 cannot move to a rear side (positive side in x-direction), the foot parts 6 being positioned at ends on an opposite side (hereinafter referred to as rear side) to a side of an opening 45 (hereinafter referred to as front side) where a wafer 5 is taken in and out, namely, on the opposite side where the wafer 5 is taken in and out in the carrier 4, and also restrict the foot parts 6 of the carrier 4 not to move to an upper side (positive side in z-direction) of the base 3; that is, they restrict the foot parts 6 not to be separated from the base 3. The front-side stoppers 2 restrict the carrier 4 not to move to the front side (negative side in x-direction). The base 3 is, for example, a base of a loader in a processing apparatus for forming semiconductor elements on a semiconductor wafer and the positioning member 30 is fixed thereto with a fixing screw 26. In FIG. 1, the direction from the front-side stoppers 2 to the rear-side stoppers 1 is the x-direction, the direction vertical to a placing face of the rear-side stoppers 1 and the front-side stoppers 2 on the base 3 is the z-direction, and the direction perpendicular to the x-direction and the z-direction is the y-direction.

As shown in FIG. 3, the carrier 4 includes a body 43 for holding the wafer 5, a side plate 41 on a side in contact with the base 3, a side plate 42 on a side opposite to the side plate 41, opening edge parts 7 connected to the body 43, and an opening 45 for taking in and out the wafer 5. The opening edge part 7 has an opening-edge-part front face 7a facing an opposed face to the carrier in the front-side stopper 2, and an opening-edge-part side face 7b that is a side face opposite to an inner side of the body 43 in which grooves for storing the wafer 5 are formed and that is connected to the opening-edge-part front face 7a. The opening edge part 7 is also an end of the opening 45 in the y-direction. In the side plates 41 and 42, the foot part 6 being the plate-shaped end part is formed on a side opposite to the side of the opening 45 (side of opening-edge-part front face 7a). When the wafer 5 is stored, the carrier 4 is typically placed with the foot part 6 being kept downward and the side of the opening 45 of the carrier 4 being kept upward. The side of the opening 45 is appropriately referred to as an opening side. The rear-side stopper 1 includes a principal part 22 formed with a hole 33, and a claw part 25. The rear-side stopper 1 includes the principal part 22 that restricts movement of the foot part 6 being the plate-shaped end part in the carrier 4 to the rear side, and the claw part 25 that restricts the movement of the foot part 6 being the plate-shaped end part in the direction vertical to the base 3. The rear-side stopper 1 is fixed to the base 3 with the fixing screw 26 inserted into the hole 33. The hole 33 is also formed in the front-side stopper 2, and the front-side stopper 2 is fixed to the base 3 with the fixing screw 26 inserted into the hole 33. A plurality of the wafers 5 is stored in the carrier 4 such that the front faces or the rear faces thereof face the base 3. FIG. 3 shows an example in which five wafers 5 are stored in the carrier 4.

FIG. 3 shows a diagram in which the carrier 4 is placed on the carrier placement platform 50. In Embodiment 1, an example is shown in which the front-side stopper 2 is cubic, and the principal part 22 of the rear-side stopper 1 is cubic. An inner side face of the front-side stopper 2, which is a side face on the side of the rear-side stopper 1, is an opposed face to the carrier that faces the opening-edge-part front face 7a of the carrier 4. An inner side face of the rear-side stopper 1, which is a side face of the principal part 22 on the side of the front-side stopper 2, is an opposed face to the carrier that faces a bottom face of the foot part 6 of the carrier 4. The opposed face to the carrier in the rear-side stopper 1 is in contact with the bottom face of the foot part 6 of the carrier 4. An inner side face of the foot part 6 (foot part inner side face) in the side plate 41 of the carrier 4 that faces the side plate 42 is in contact with an inner side face (claw part inner side face) of the claw part 25 facing the base 3 in the rear-side stopper 1. The opposed face to the carrier in the front stopper 2 is in contact with the opening-edge-part front face 7a of the carrier 4. The two front-side stoppers 2 come into contact with the two opening edge parts 7 that are the ends of the opening 45 of the carrier 4, and restrict movement of the carrier 4 to the front side. The two rear-side stoppers 1 come into contact with the foot parts 6 that are the two plate-shaped end parts formed on the rear side of the carrier 4, and restrict the movement of the carrier 4 to the rear side and the movement in the direction vertical to the base 3. In the carrier 4, the opening-edge-part front faces 7a are in contact with the opposed faces to the carrier in the front stoppers 2, and the foot parts 6 are in contact with the opposed faces to the carrier in the principal parts 22 of the rear-side stoppers 1 and are in contact with the claw part inner side faces of the claw parts 25, so that the position in the horizontal direction is restricted; that is, the carrier 4 is positioned at a set position of the carrier placement platform 50.

As shown in FIG. 3, in the carrier 4 placed on the carrier placement platform 50, the movement of the foot parts 6 to the upper side is restricted by the rear-side stoppers 1. Therefore, the foot parts 6 of the carrier 4 cannot be moved in the direction directly upward, that is, in the direction vertical to the placing face of the rear-side stoppers 1 and the front-side stoppers 2 on the base 3 (positive side in z-direction). Further, the carrier 4 cannot be placed on the carrier placement platform 50 from the direction directly above the base 3 of the carrier placement platform 50 owing to the claw parts 25 of the rear-side stoppers 1. Since the positioning member 30 and the carrier placement platform 50 are provided with the rear-side stoppers 1 having the claw parts 25, the positioning member 30 and the carrier placement platform 50 have structures in which the carrier 4 cannot be placed from the directly upward direction, and the carrier 4 cannot be moved in the directly upward direction.

Referring to FIGS. 4 and 5, a method of moving the carrier 4 from the carrier placement platform 50 will be described. In FIGS. 4 and 5, the base 3 is omitted. When the carrier 4 placed on the carrier placement platform 50 is moved from the base 3 of the carrier placement platform 50 as shown in FIG. 3, if the carrier 4 is tilted as indicated by an arrow 8 as shown in FIG. 4, the opening edge parts 7 being front side of the carrier 4 are lifted up as indicated by an arrow 9. Then, the opening edge parts 7 are tilted until they become higher than the front-side stoppers 2. Further, as shown in FIG. 5, while the carrier 4 is kept tilted to the rear side, the opening edge parts 7 are kept in a state where the movement thereof is not restricted by the front-side stoppers 2, and the carrier 4 is moved forward and obliquely upward as indicated by an arrow 10. Then, the foot parts 6 move to the front side as indicated by an arrow 11, and exit from the rear-side stoppers 1. When the carrier 4 is moved from the base 3 of the carrier placement platform 50, since the opening edge parts 7 of the carrier 4 pass upper sides of the front-side stoppers 2 with contacting the front-side stoppers 2 or without contacting the front-side stoppers 2, the carrier 4 is not tilted to the front side.

When the foot parts 6 exit from the rear-side stoppers 1, the movement of the foot parts 6 is not restricted by the rear-side stoppers 1, so that the carrier 4 can be moved upward from the base 3 of the carrier placement platform 50. Since the carrier 4 is tilted to the rear side when the carrier 4 is moved from the carrier placement platform 50, the carrier is not tilted to the front side by mistake. When the carrier 4 is placed on the carrier placement platform 50, the reverse procedure is performed. Even in this case, since the carrier 4 is tilted to the rear side, the carrier 4 is not tilted to the front side by mistake. It should be noted that the placing of the carrier 4 on the carrier placement platform 50 and the movement of the carrier 4 from the carrier placement platform 50 are performed by a robot arm or an operator of a processing apparatus.

The positioning member 30 of Embodiment 1 includes the rear-side stoppers 1 and the front-side stoppers 2 that are designed such that the carrier 4 is always tilted to the rear side when the carrier 4 is placed on the base 3 or when the carrier 4 is moved from the base 3. Therefore, the carrier 4 is not tilted to the front side by mistake, and plate-shaped loads (wafers 5) can be prevented from slipping off from the carrier 4. The carrier placement platform 50 of Embodiment 1 includes the rear-side stoppers 1 and the front-side stoppers 2 that are designed such that the carrier 4 is always tilted to the rear side when the carrier 4 is placed on the base 3 or when the carrier 4 is moved from the base 3. Therefore, the carrier 4 is not tilted to the front side by mistake, and the plate-shaped loads (wafers 5) can be prevented from slipping off from the carrier 4.

As described above, the positioning member 30 of Embodiment 1 is a carrier positioning member that is fixed to the base 3 and that positions, on the base 3, the carrier 4 storing a plurality of the plate-shaped loads (wafers 5) such that the front faces or the rear faces thereof face the base 3. A side in the opening 45 of the carrier 4 in which the plate-shaped loads (wafers 5) is taken in and out is the front side, and a side opposite to the opening 45 of the carrier 4 is the rear side. The positioning member 30 of Embodiment 1 is provided with the two front-side stoppers 2 that come into contact with the two opening edge parts 7 being the ends of the opening 45 of the carrier 4 to restrict the movement of the carrier 4 to the front side, and the two rear-side stoppers 1 that come into contact with the two plate-shaped end parts (foot parts 6) formed at the rear side of the carrier 4 to restrict the movement of the carrier 4 to the rear side and the movement in the direction vertical to the base 3. With the configuration of the positioning member 30 of Embodiment 1, since the two front-side stoppers 2 restrict the movement of the carrier 4 to the front side and the two rear-side stoppers 1 restrict the movement of the carrier 4 to the rear side and the movement in the direction vertical to the base 3, when the carrier 4 is placed on the base 3 on which the positioning member 30 for the carrier is fixed or when the carrier 4 is moved from the base 3 on which the positioning member 30 for the carrier is fixed, the plate-shaped loads (wafers 5) can be prevented from slipping off from the carrier 4.

As described above, the carrier placement platform 50 of Embodiment 1 includes the base 3 and the positioning member 30 fixed to the base 3. The positioning member 30 is the carrier positioning member that is fixed to the base 3 and that positions, on the base 3, the carrier 4 storing a plurality of the plate-shaped loads (wafers 5) such that the front faces or the rear faces thereof face the base 3. The side in the opening 45 of the carrier 4 in which the plate-shaped loads (wafers 5) is taken in and out is the front side, and the side opposite to the opening 45 of the carrier 4 is the rear side. The positioning member 30 is provided with the two front-side stoppers 2 that come into contact with the two opening edge parts 7 being the ends of the opening 45 of the carrier 4 to restrict the movement of the carrier 4 to the front side, and the two rear-side stoppers 1 that come into contact with the two plate-shaped end parts (foot parts 6) formed at the rear side of the carrier 4 to restrict the movement of the carrier 4 to the rear side and the movement in the direction vertical to the base 3. With the configuration of the carrier placement platform 50 of Embodiment 1, since the two front-side stoppers 2 restrict the movement of the carrier 4 to the front side and the two rear-side stoppers 1 restrict the movement of the carrier 4 to the rear side and the movement in the direction vertical to the base 3, when the carrier 4 is placed on the base 3 of the carrier placement platform 50 or when the carrier 4 is moved from the base 3 of the carrier placement platform 50, the plate-shaped loads (wafers 5) can be prevented from slipping off from the carrier 4.

Embodiment 2

Figure 6:
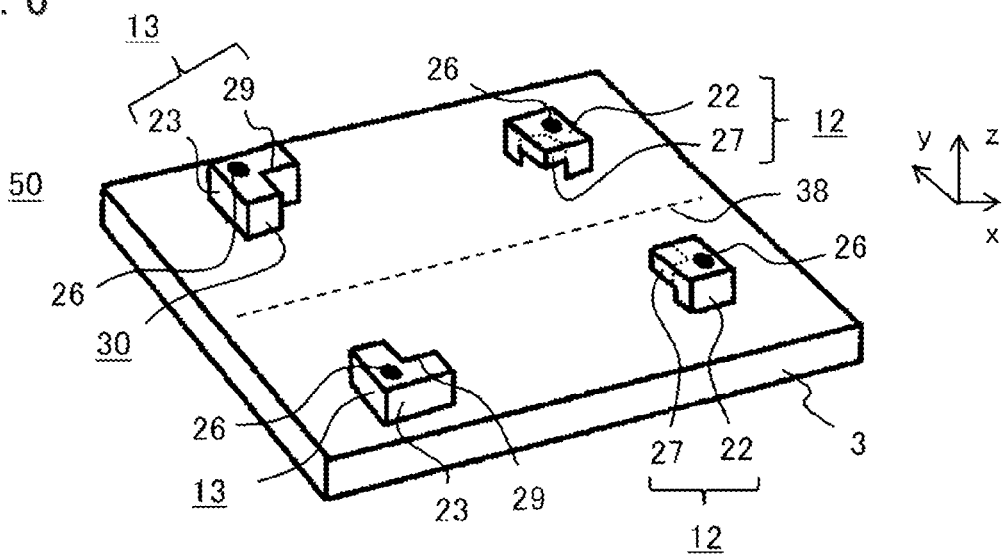
FIG. 6 is a diagram showing a positioning member and a carrier placement platform according to Embodiment 2.
Figure 7:
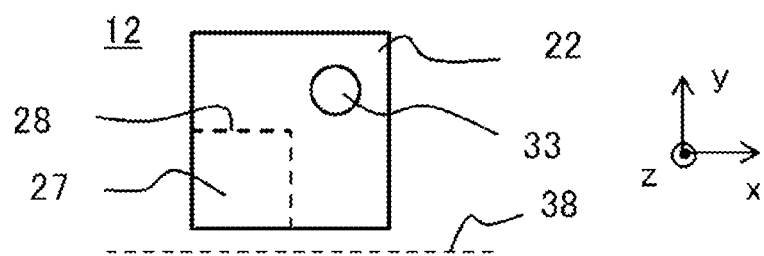
FIG. 7 is a plan view of a rear-side stopper of FIG. 6.
Figure 8:
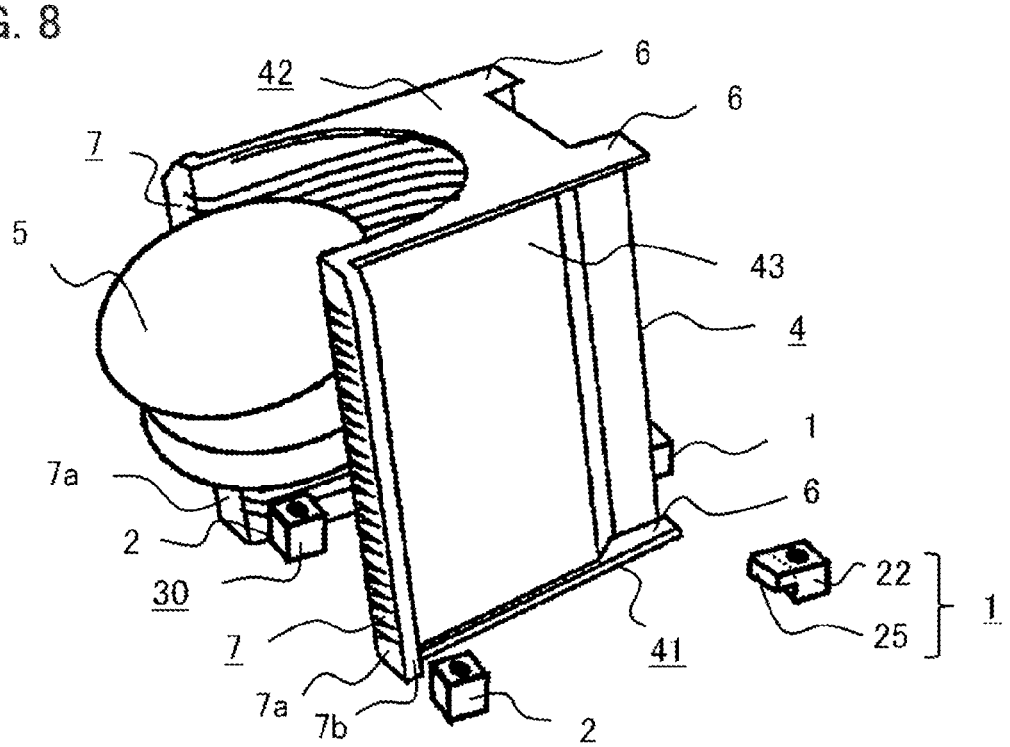
FIG. 8 is a diagram for explaining problems of the positioning member and the carrier placement platform according to Embodiment 2.

FIG. 6 is a diagram showing a positioning member and a carrier placement platform according to Embodiment 2. FIG. 7 is a plan view of a rear-side stopper of FIG. 6. FIG. 8 is a diagram for explaining problems of the positioning member and the carrier placement platform according to Embodiment 2. In the drawings, components common to those of Embodiment 2 are denoted by the same reference numerals and signs as those of Embodiment 1. The positioning member 30 and the carrier placement platform 50 of Embodiment 2 are different from the positioning member 30 and the carrier placement platform 50 of Embodiment 1 in that rear-side stoppers 12 and front-side stoppers 13 having a lateral displacement prevention function are placed on the base 3 in place of the rear-side stoppers 1 and the front-side stoppers 2. In FIG. 8, the base 3 is omitted.

Referring to FIG. 8, the problems of the positioning member 30 and the carrier placement platform 50 of Embodiment 2 will be described. In the carrier placement platform 50 on which the positioning member 30 of Embodiment 1 is fixed, there is a short period of time during which the carrier 4 can move in a lateral direction (y-direction). That is, when the carrier 4 is moved from the base 3 of the carrier placement platform 50, the opening edge parts 7 of the carrier 4 may come off from the front-side stoppers 2 as shown in FIG. 8 if the carrier 4 is displaced in the lateral direction by mistake. Specifically, when the carrier 4 is tilted such that the opening edge parts 7 of the carrier 4 are higher than the front-side stoppers 2, movement of the opening edge parts 7 of the carrier 4 cannot be restricted by the front-side stoppers 2, and when the carrier 4 is displaced in the lateral direction by mistake, the foot parts 6 of the carrier 4 may come off from the rear-side stoppers 1. When the foot parts 6 of the carrier 4 come off from the rear-side stoppers 1, the carrier 4 is tilted to a front side by mistake, and the wafer 5 may slip off.

In the positioning member 30 of Embodiment 2, since the rear-side stoppers 12 and the front-side stoppers 13 have the function of preventing the lateral displacement, lateral movement of the carrier 4 can be restricted when the carrier 4 is moved from the base 3, and the fall of the wafer 5 caused by the lateral displacement can be prevented. In the carrier placement platform 50 of Embodiment 2, since the rear-side stoppers 12 and the front-side stoppers 13 have the function of preventing the lateral displacement, the lateral movement can be restricted when the carrier 4 is moved from the base 3, and the fall of the wafer 5 caused by the lateral displacement can be prevented. Referring to FIGS. 6 and 7, the positioning member 30 and the carrier placement platform 50 of Embodiment 2 will be described in detail.

The positioning member 30 includes two rear-side stoppers 12 and two front-side stoppers 13. In FIG. 6, the direction from the front-side stoppers 13 to the rear-side stoppers 12 is the x-direction, the direction vertical to the placing face of the rear-side stoppers 12 and the front-side stoppers 13 on the base 3 is the z-direction, and the direction perpendicular to the x-direction and the z-direction is the y-direction. FIG. 7 shows the rear-side stopper 12 on the positive side in the y-direction. The rear-side stopper 12 on the negative side in the y-direction has a shape such that the rear-side stopper 12 on the positive side in the y-direction is inverted in shape with respect to a broken line 38 of the x-direction. The front-side stopper 13 on the negative side in the y-direction and the front-side stopper 13 on the positive side in the y-direction are inverted in shape to each other with respect to the broken line 38 of the x-direction.

The rear-side stopper 12 includes a principal part 22 formed with the hole 33, and a claw part 27. The rear-side stopper 12 is fixed to the base 3 with the fixing screw 26 inserted into the hole 33. A recessed portion 28 is formed in the principal part 22. The front-side stopper 13 includes a principal part 23 formed with the hole 33 and having a recessed portion 29. The front-side stopper 13 is fixed to the base 3 with the fixing screw 26 inserted into the hole 33. Since the front-side stopper 13 is the principal part 23 having the recessed portion 29, it can also be expressed as having the recessed portion 29.

The principal part 22 of the rear-side stopper 12 restricts the foot part 6 of the carrier 4 not to move to the rear side (positive side in x-direction) and also restricts the foot part 6 of the carrier 4 not to move outward in the lateral direction (y-direction). The claw part 27 of the rear-side stopper 12 restricts movement of the foot part 6 of the carrier 4 to the upper side (positive side in z-direction) of the base 3; that is, it restricts the movement not to be separated from the base 3. Two, or a pair of the rear-side stoppers 12 restrict the movement of the carrier 4 in the lateral direction (positive and negative sides in y-direction). As shown in FIGS. 6 and 7, the principal part 22 has the recessed portion 28; that is, the recessed portion 28 is formed in the principal part 22. Further, side faces of the recessed portion 28 are opposed faces to the carrier in the principal part 22, which face a bottom face and an outside face of the foot part 6 of the carrier 4. The broken line shown in the rear-side stopper 12 of FIGS. 6 and 7 indicates the side faces of the recessed portion 28, that is, the opposed faces to the carrier. The rear-side stopper 12 includes the principal part 22 in which the recessed portion 28 is formed to restrict the movement of the foot part 6 being the plate-shaped end part of the carrier 4 to the rear side, and to restrict the movement of the foot part 6 being the plate-shaped end part to an outer side of the carrier 4 in the lateral direction that is horizontal to the base 3 and perpendicular to a direction of the front side, and includes the claw part 27 to restrict the movement of the foot part 6 being the plate-shaped end part in the direction vertical to the base 3.

The front-side stopper 13 restricts the carrier 4 not to move to the front side (negative side in x-direction) and also restricts the opening edge part 7 of the carrier 4 not to move outward in the lateral direction (y-direction). Two, or a pair of the front-side stoppers 13 restrict the movement of the opening edge parts 7 of the carrier 4 in the lateral direction (positive and negative sides in y-direction). That is, the front-side stoppers 13 include the recessed portions 29 to restrict the movement of the opening edge parts 7 of the carrier 4 to the front side, and to restrict the movement of the opening edge parts 7 to the outer side of the carrier in the lateral direction that is horizontal to the base 3 and perpendicular to the direction of the front side.

In the positioning member 30 and the carrier placement platform 50 of Embodiment 2, similarly to the positioning member 30 and the carrier placement platform 50 of Embodiment 1, the rear-side stoppers 12 restrict the foot parts 6 of the carrier 4 so that the carrier 4 cannot move to the rear side (positive side in the x-direction), and also restrict the foot parts 6 of the carrier 4 not to move to the upper side (positive side in the z-direction) of the base 3; that is, they restrict the foot parts not to be separated from the base 3, and the front-side stoppers 13 restrict the carrier 4 not to move to the front side (negative side in x-direction). Further, in the positioning member 30 and the carrier placement platform 50 of Embodiment 2, a pair of the rear-side stoppers 12 restrict the foot parts 6 of the carrier 4 not to move in the lateral direction (y-direction) owing to the recessed portions 28, and the front-side stoppers 13 restrict the opening edge parts 7 of the carrier 4 not to move in the lateral direction (y-direction) owing to the recessed portions 29. Since the positioning member 30 and the carrier placement platform 50 of Embodiment 2 restrict the opening edge parts 7 and the foot parts 6 of the carrier 4 not to move in the lateral direction (y-direction), the carrier 4 is not displaced laterally on the base 3 when the carrier 4 is moved from the base 3; that is, when the opening edge parts 7 of the carrier 4 are higher than the front-side stoppers 2, and thus the fall of the wafer 5 caused by the lateral displacement described in FIG. 8 can be prevented. In the positioning member 30 and the carrier placement platform 50 of Embodiment 2, when the carrier 4 is moved from the base 3; that is, when the opening edge parts 7 of the carrier 4 are higher than the front-side stoppers 2, the carrier 4 is not displaced laterally on the base 3. Therefore, the opening edge parts 7 of the carrier 4 pass the upper sides of the front-side stoppers 13 with contacting the front-side stoppers 13 or without contacting the front-side stoppers 13, so that the carrier 4 is not tilted to the front side.

The positioning member 30 of Embodiment 2 is designed such that the carrier 4 is tilted to the rear side without fail when the carrier 4 is placed on the base 3 or when the carrier 4 is moved from the base 3, and is provided with the rear-side stoppers 12 including the principal parts 22 formed with the recessed portions 28 and the front-side stoppers 13 including the recessed portions 29 that restrict the carrier 4 not to move in the front-rear direction (x-direction) and the lateral direction (y-direction). Further, the rear-side stoppers 12 include the claw parts 27 to restrict the separation of the carrier 4 from the base 3. Therefore, in the positioning member 30 of Embodiment 2, when the carrier 4 is moved from the base 3, the carrier 4 is not displaced laterally, the carrier 4 is not tilted to the front side by mistake, and the plate-shaped loads (wafers 5) can be prevented from slipping off from the carrier 4. The carrier placement platform 50 of Embodiment 2 is designed such that the carrier 4 is tilted to the rear side without fail when the carrier 4 is placed on the base 3 or when the carrier 4 is moved from the base 3, and is provided with the rear-side stoppers 12 including the principal parts 22 formed with the recessed portions 28 and the front-side stoppers 13 including the recessed portions 29 that restrict the carrier 4 not to move in the front-rear direction (x-direction) and the lateral direction (y-direction). Further, the rear-side stoppers 12 include the claw parts 27 to restrict the separation of the carrier 4 from the base 3. Therefore, in the carrier placement platform 50 of Embodiment 2, when the carrier 4 is moved from the base 3, the carrier 4 is not displaced laterally, the carrier 4 is not tilted to the front side by mistake, and the plate-shaped loads (wafers 5) can be prevented from slipping off from the carrier 4.

Embodiment 3

Figure 9:
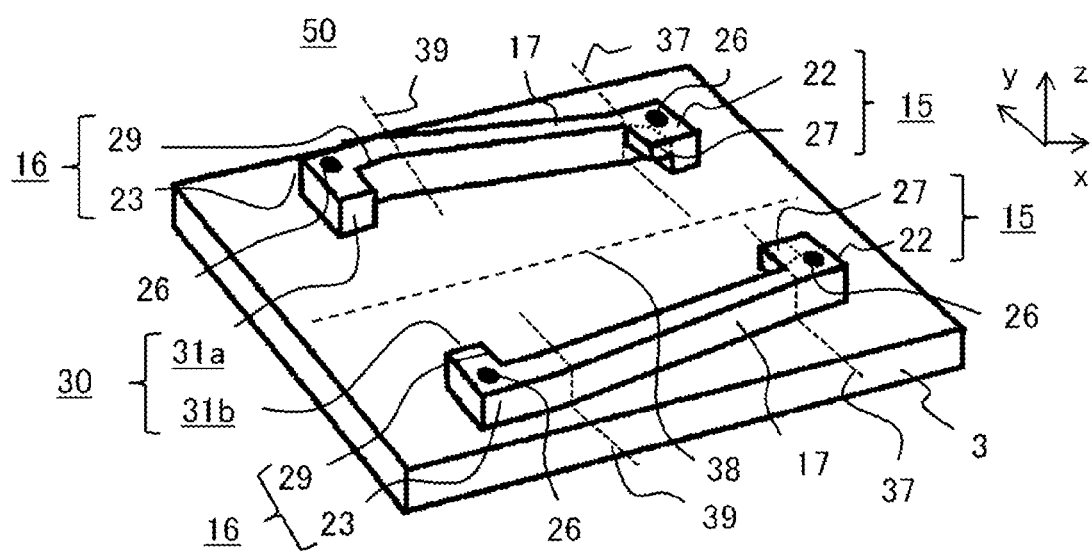
FIG. 9 is a diagram showing a positioning member and a carrier placement platform according to Embodiment 3.
Figure 10:
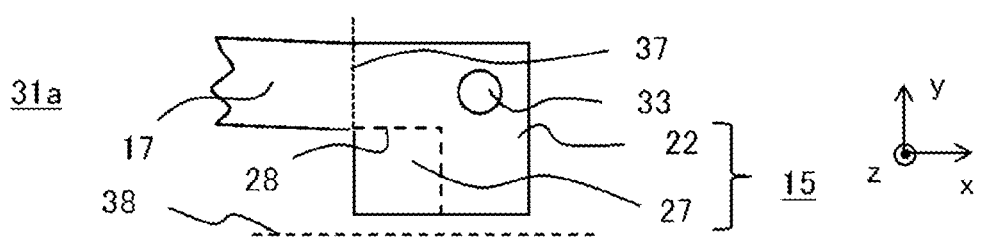
FIG. 10 is a plan view of a rear-side stopper part of FIG. 9.
Figure 11:
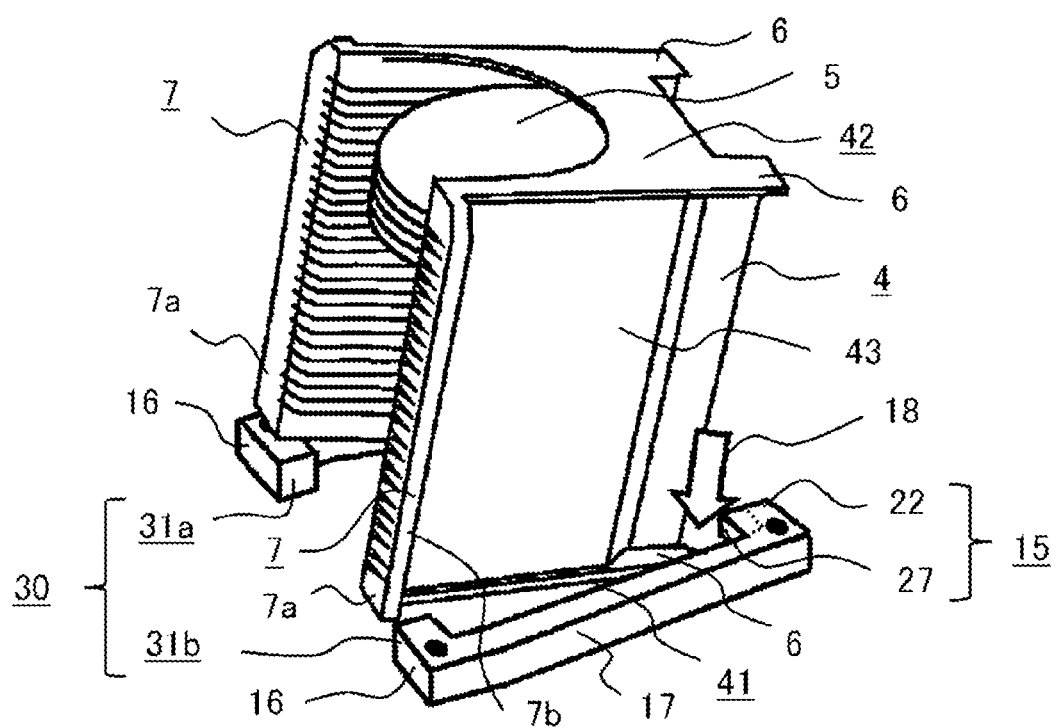
FIG. 11 is a diagram for explaining a method of placing a carrier on the carrier placement platform of FIG. 9.
Figure 12:
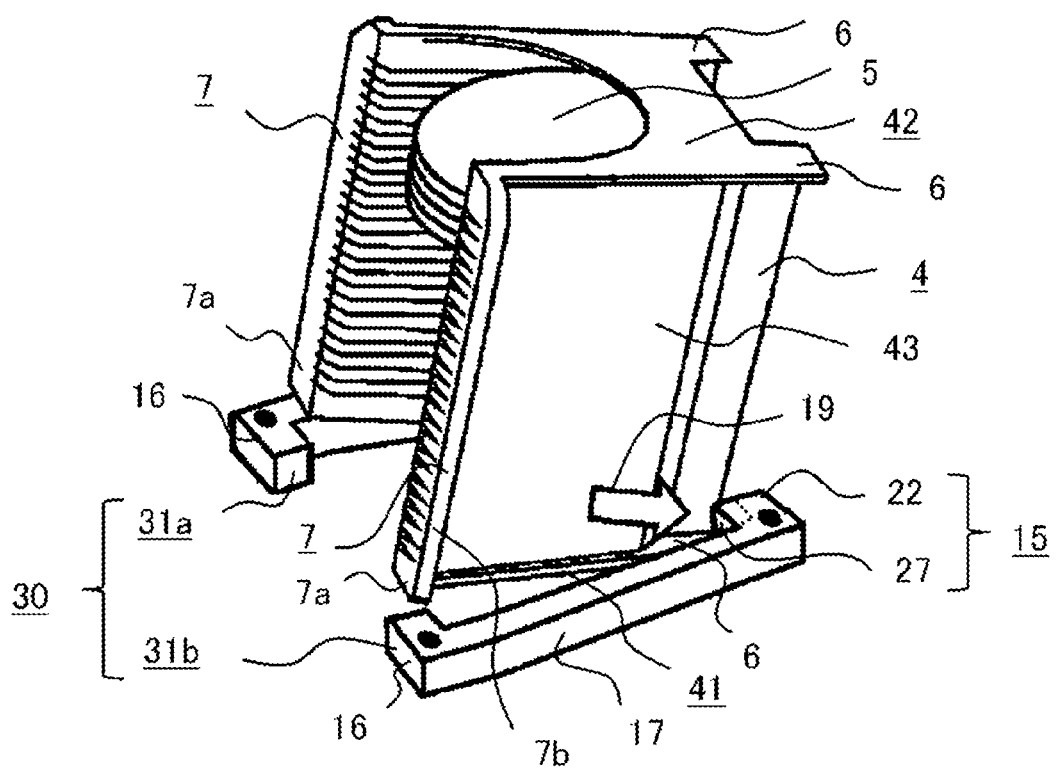
FIG. 12 is a diagram for explaining a method of placing the carrier on the carrier placement platform of FIG. 9.
Figure 13:
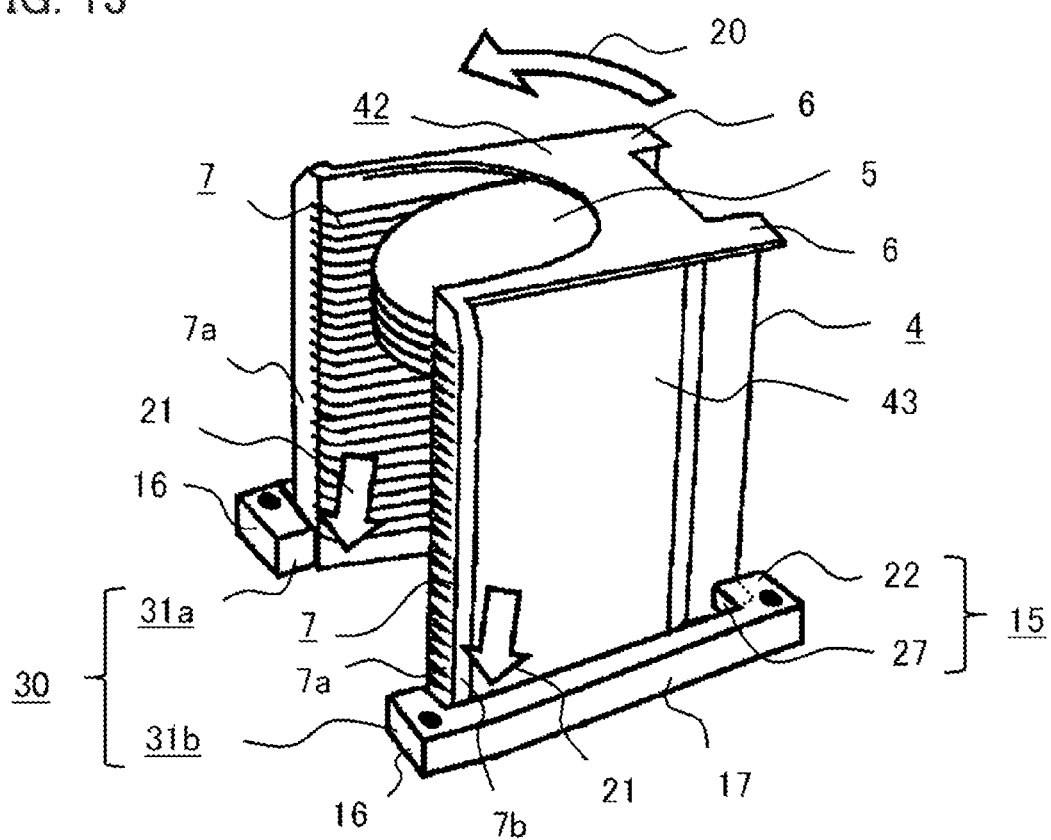
FIG. 13 is a diagram for explaining a method of placing the carrier on the carrier placement platform of FIG. 9.

FIG. 9 is a diagram showing a positioning member and a carrier placement platform according to Embodiment 3, and FIG. 10 is a plan view of a rear-side stopper part of FIG. 9. FIGS. 11, 12, and 13 are diagrams for explaining a method of placing the carrier on the carrier placement platform of FIG. 9. In the drawings, components common to Embodiments 1 and 2 are denoted by the same reference numerals and signs as those in Embodiments 1 and 2. The positioning member 30 and the carrier placement platform 50 of Embodiment 3 are different from the positioning member 30 and the carrier placement platform 50 of Embodiments 1 and 2 in that they are provided with two support members 31a and 31b instead of four stoppers. In FIGS. 11, 12 and 13, the base 3 is omitted.

The positioning member 30 includes two support members 31a and 31b. The support members 31a and 31b each include a rear-side stopper part 15, a front-side stopper part 16, and a guide part 17 that connects the rear-side stopper part 15 and the front-side stopper part 16 and guides the carrier 4 to the rear-side stopper part 15. In FIG. 9, the direction from the front-side stopper part 16 to the rear-side stopper part 15 is the x-direction, the direction vertical to a placing face of the rear-side stopper part 15 and the front-side stopper part 16 on the base 3 is the z-direction, and the direction perpendicular to the x-direction and the z-direction are the y-direction. The support member 31a and the support member 31b are inverted in shape to each other with respect to the broken line 38 of the x-direction. FIG. 10 shows the rear-side stopper part 15 on the positive side in the y-direction, that is, the rear-side stopper part 15 of the support member 31a. The rear-side stopper part 15 on the negative side in the y-direction, that is, the rear-side stopper part 15 of the support member 31b, has a shape in which the rear-side stopper part 15 on the positive side in the y-direction is inverted with respect to the broken line 38 of the x-direction. The front-side stopper part 16 on the negative side in the y-direction and the front-side stopper part 16 on the positive side in the y-direction are inverted in shape to each other with respect to the broken line 38 of the x direction.

The rear-side stopper part 15 is a part on the positive side in the x-direction from the broken line 37, and includes the principal part 22 formed with the hole 33, and the claw part 27. The rear-side stopper part 15 is fixed to the base 3 with the fixing screw 26 inserted into the hole 33. The front-side stopper part 16 is a part on the negative side in the x-direction from a broken line 39, and includes the principal part 23 formed with the hole 33 and having the recessed portion 29. The front-side stopper part 16 is fixed to the base 3 with the fixing screw 26 inserted into the hole 33. Since the front-side stopper part 16 is the principal part 23 having the recessed portion 29, it can also be expressed as having the recessed portion 29. The guide part 17 is a part from the broken line 39 to the broken line 37, and is the part for guiding the plate-shaped end part (foot part 6) of the carrier 4 to the recessed portion 28 and the claw part 27.

The principal part 22 of the rear-side stopper part 15 restricts the foot part 6 of the carrier 4 not to move to the rear side (positive side in x-direction) and also restricts the foot part 6 of the carrier 4 not to move outward in the lateral direction (y-direction). The claw part 27 of the rear-side stopper part 15 restricts movement of the foot part 6 of the carrier 4 to the upper side (positive side in z-direction) of the base 3; that is, it restricts the foot part not to be separated from the base 3. Two, or a pair of the rear-side stopper parts 15 of the support members 31a and 31b restrict movement of the carrier 4 in the lateral direction (positive and negative sides in y-direction). As shown in FIGS. 9 and 10, the principal part 22 has the recessed portion 28; that is, the recessed portion 28 is formed in the principal part 22. Further, side faces of the recessed portion 28 are opposed faces to the carrier in the principal part 22, which face a bottom face and an outside face of the foot part 6 of the carrier 4. The broken line shown in the rea-side stopper part 15 of FIGS. 9 and 10 indicates the side faces of the recessed portion 28, that is, the opposed faces to the carrier.

The front-side stopper part 16 restricts the carrier 4 not to move to the front side (negative side in x-direction) and also restricts the opening edge part 7 of the carrier 4 not to move outward in the lateral direction (y-direction). Two, or a pair of the front-side stopper parts 16 of the support members 31a and 31b restrict movement of the opening edge parts 7 of the carrier 4 in the lateral direction (positive and negative sides in y-direction). That is, the front-side stopper parts 16 include the recessed portions 29 to restrict the movement of the opening edge parts 7 of the carrier 4 to the front side, and to restrict the movement of the opening edge parts 7 to an outer side of the carrier in the lateral direction that is horizontal to the base 3 and perpendicular to the front side direction.

In the positioning member 30 and the carrier placement platform 50 of Embodiment 1, when the carrier 4 is placed on the base 3, the foot part 6 of the carrier 4 needs to be positioned on the front side of the rear-side stopper 1, and correctly inserted into a gap between the claw part 25 and the base 3 in the rear-side stopper 1. If the carrier 4 is moved by mistake to the rear side (positive side in x-direction) with the positions of the carrier 4 and the rear-side stopper 1 greatly displaced, since the foot part 6 of the carrier 4 does not hit the rear-side stopper 1, the carrier 4 may further move to the rear side, and one of the rear-side stoppers 1 positioned between the two foot parts 6 may enter a portion of the side plate 41 of the carrier 4 where the foot part 6 is not present. If the wafer 5 is placed on the side of the side plate 41 (base 3 side) of the carrier 4, the rear-side stopper 1 may collide with the wafer 5 on the side of the side plate 41.

In the positioning member 30 and the carrier placement platform 50 of Embodiment 3, since the support members 31a and 31b are provided with the guide parts 17 for guiding the carrier 4 to the rear-side stopper parts 15, the positioning of the carrier with respect to the rear-side stopper parts 15 is ensured when the carrier 4 is placed on the base 3 of the carrier placement platform 50, and the collision between the rear-side stopper part 15 and the wafer 5 on the side of the side plate 41 can be prevented. Referring to FIGS. 11 to 13, a method of placing the carrier 4 on the carrier placement platform 50 of Embodiment 3 will be described.

When the carrier 4 is placed on the base 3 of the carrier placement platform 50, as shown in FIG. 11, the foot parts 6 of the carrier 4 are inserted into inner sides of the guide parts 17 of the support members 31a and 31b as indicated by an arrow 18. Since the opening edge parts 7 of the carrier 4 pass the upper sides of the front-side stopper parts 16 of the support members 31a and 31b with contacting the front-side stopper parts 16 or without contacting the front-side stopper parts 16, the carrier 4 is not tilted to the front side. Next, as shown in FIG. 12, when the foot parts 6 of the carrier 4 are moved to the rear side (positive side in x-direction) as indicated by an arrow 19, the guide parts 17 guide the foot parts 6 into the rear-side stopper parts 15, and the rear-side stopper parts 15 restrict the movement of the foot parts 6 of the carrier 4, so that the carrier 4 does not move further backward. Next, as shown in FIG. 13, when the carrier 4 is turned as indicated by an arrow 20 to be vertical with respect to the base 3, the opening edge parts 7 of the carrier 4 fit into the front stopper parts 16 of the support members 31a and 31b as indicated by an arrow 21.

Since the support members 31a and 31b of Embodiment 3 are provided with the rear-side stopper parts 15 having the same shape as the rear-side stoppers 12 of Embodiment 2 and the front-side stopper parts 16 having the same shape as the front-side stoppers 13 of Embodiment 2, the positioning member 30 and the carrier placement platform 50 of Embodiment 3 have the same effects as the positioning member 30 and the carrier placement platform 50 of Embodiment 2. That is, the positioning member 30 of Embodiment 3 is designed such that the carrier 4 is tilted to the rear side without fail when the carrier 4 is placed on the base 3 or when the carrier 4 is moved from the base 3, and is provided with the rear-side stopper parts 15 including the principal parts 22 formed with the recessed portions 28 and the front-side stopper parts 16 including the recessed portions 29 that restrict the carrier 4 not to move in the front-rear direction (x-direction) and the lateral direction (y-direction). Further, the rear-side stoppers 15 include the claw parts 27 to restrict the separation of the carrier 4 from the base 3. Therefore, in the positioning member 30 of Embodiment 3, when the carrier 4 is moved from the base 3, the carrier 4 is not displaced laterally, the carrier 4 is not tilted to the front side by mistake, and plate-shaped loads (wafers 5) can be prevented from slipping off from the carrier 4. Furthermore, in the positioning member 30 of Embodiment 3, since the support members 31a and 31b are provided with the guide parts 17 for guiding the carrier 4 to the rear-side stopper parts 15, the positioning of the carrier with respect to the rear-side stopper parts 15 is ensured when the carrier 4 is placed on the base 3, and the collision between the rear-side stopper part 15 and the wafer 5 on the side of the side plate 41 can be prevented.

The carrier placement platform 50 of Embodiment 3 is designed such that the carrier 4 is tilted to the rear side without fail when the carrier 4 is placed on the base 3 or when the carrier 4 is moved from the base 3, and is provided with the rear-side stopper parts 15 including the principal parts 22 formed with the recessed portions 28 and the front-side stopper parts 16 including the recessed portions 29 that restrict the carrier 4 not to move in the front-rear direction (x-direction) and the lateral direction (y-direction). Further, the rear-side stoppers 15 include the claw parts 27 to restrict the separation of the carrier 4 from the base 3. Therefore, in the carrier placement platform 50 of Embodiment 3, when the carrier 4 is moved from the base 3, the carrier 4 is not displaced laterally, the carrier 4 is not tilted to the front side by mistake, and the plate-shaped loads (wafers 5) can be prevented from slipping off from the carrier 4. Furthermore, in the carrier placement platform 50 of Embodiment 3, since the support members 31a and 31b are provided with the guide parts 17 for guiding the carrier 4 to the rear-side stopper parts 15, the positioning of the carrier with respect to the rear-side stopper parts 15 is ensured when the carrier 4 is placed on the base 3, and the collision between the rear-side stopper part 15 and the wafer 5 on the side of the side plate 41 can be prevented.

The positioning member 30 of Embodiment 3 is a carrier positioning member that is fixed to the base 3 and that positions, on the base 3, the carrier 4 storing a plurality of the plate-shaped loads (wafers 5) such that the front faces or the rear faces thereof face the base 3. A side in the opening 45 of the carrier 4 in which the plate-shaped loads (wafers 5) is taken in and out is the front side, and a side opposite to the opening 45 of the carrier 4 is the rear side. The positioning member 30 of Embodiment 3 is provided with a first support member 31a including a first front-side stopper part 16 that comes into contact with a first opening edge part 7 being one end of the opening 45 of the carrier 4 to restrict the movement of the carrier 4 to the front side, a first rear-side stopper part 15 that comes into contact with a first plate-shaped end part (foot part 6) formed on the rear side of the carrier 4 to restrict the movement of the carrier 4 to the rear side and the movement in the direction vertical to the base 3, and a first guide part 17 that connects the first front-side stopper part 16 and the first rear-side stopper part 15 and guides the first plate-shaped end part (foot part 6) of the carrier 4 to the first rear-side stopper part 15. Further, the positioning member 30 of Embodiment 3 is provided with a second support member 31b including a second front-side stopper part 16 that comes into contact with a second opening edge part 7 being the other end of the opening 45 of the carrier 4 to restrict the movement of the carrier 4 to the front side, a second rear-side stopper part 15 that comes into contact with a second plate-shaped end part (foot part 6) formed on the rear side of the carrier 4 to restrict the movement of the carrier 4 to the rear side and the movement in the direction vertical to the base 3, and a second guide part 17 that connects the second front-side stopper part 16 and the second rear-side stopper part 15 and guides the second plate-shaped end part (foot part 6) of the carrier 4 to the second rear-side stopper part 15. With the configuration of the positioning member 30 of Embodiment 3, since the two front-side stopper parts 16 restrict the movement of the carrier 4 to the front side and the two rear-side stopper parts 15 restrict the movement of the carrier 4 to the rear side and the movement in the direction vertical to the base 3, when the carrier 4 is placed on the base 3 on which the positioning member 30 for the carrier is fixed or when the carrier 4 is moved from the base 3 on which the positioning member 30 for the carrier is fixed, the plate-shaped loads (wafers 5) can be prevented from slipping off from the carrier 4.

The carrier placement platform 50 of Embodiment 3 is provided with the base 3 and the positioning member 30 fixed to the base 3. The positioning member 30 is a carrier positioning member that is fixed to the base 3 and that positions, on the base 3, the carrier 4 storing a plurality of the plate-shaped loads (wafers 5) such that the front faces or the rear faces thereof face the base 3. The side in the opening 45 of the carrier 4 in which the plate-shaped loads (wafers 5) is taken in and out is the front side, and the side opposite to the opening 45 of the carrier 4 is the rear side. The positioning member 30 is provided with a first support member 31a including a first front-side stopper part 16 that comes into contact with a first opening edge part 7 being one end of the opening 45 of the carrier 4 to restrict the movement of the carrier 4 to the front side, a first rear-side stopper part 15 that comes into contact with a first plate-shaped end part (foot part 6) formed on the rear side of the carrier 4 to restrict the movement of the carrier 4 to the rear side and the movement in the direction vertical to the base 3, and a first guide part 17 that connects the first front-side stopper part 16 and the first rear-side stopper part 15 and guides the first plate-shaped end part (foot part 6) of the carrier 4 to the first rear-side stopper part 15. The positioning member 30 is provided with a second support member 31b including a second front-side stopper part 16 that comes into contact with a second opening edge part 7 being the other end of the opening 45 of the carrier 4 to restrict the movement of the carrier 4 to the front side, a second rear-side stopper part 15 that comes into contact with a second plate-shaped end part (foot part 6) formed on the rear side of the carrier 4 to restrict the movement of the carrier 4 to the rear side and the movement in the direction vertical to the base 3, and a second guide part 17 that connects the second front-side stopper part 16 and the second rear-side stopper part 15 and guides the second plate-shaped end part (foot part 6) of the carrier 4 to the second rear-side stopper part 15. With the configuration of the carrier placement platform 50 of Embodiment 3, since the two front-side stopper parts 16 restrict the movement of the carrier 4 to the front side and the two rear-side stopper parts 15 restrict the movement of the carrier 4 to the rear side and the movement in the direction vertical to the base 3, when the carrier 4 is placed on the base 3 of the carrier placement platform 50 or when the carrier 4 is moved from the base 3 of the carrier placement platform 50, the plate-shaped loads (wafers 5) can be prevented from slipping off from the carrier 4.

Embodiment 4

Figure 14:
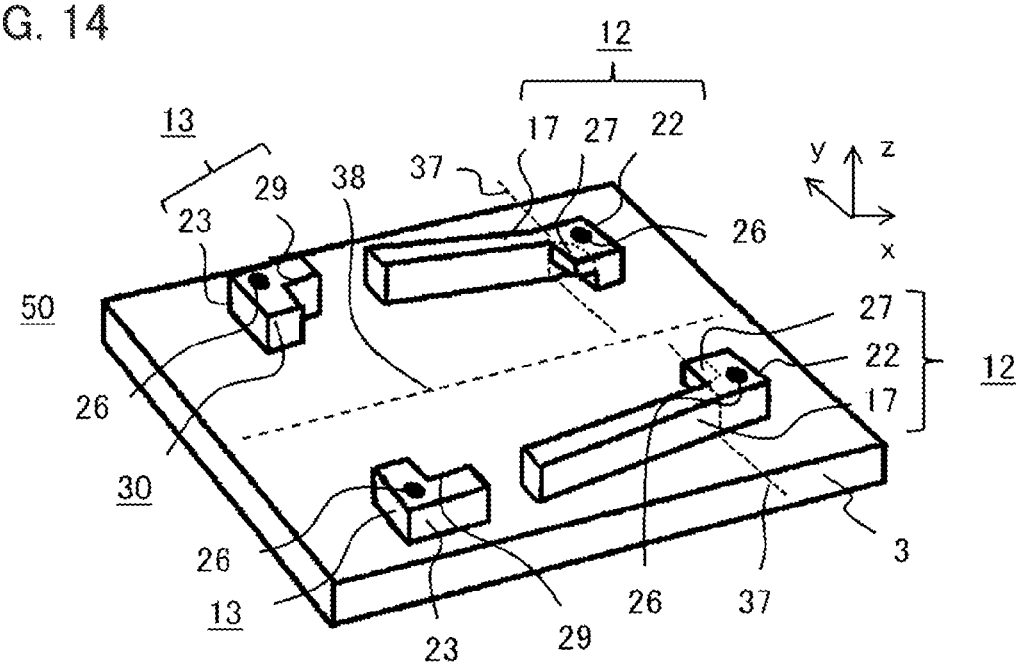
FIG. 14 is a diagram showing a positioning member and a carrier placement platform according to Embodiment 4.
Figure 15:
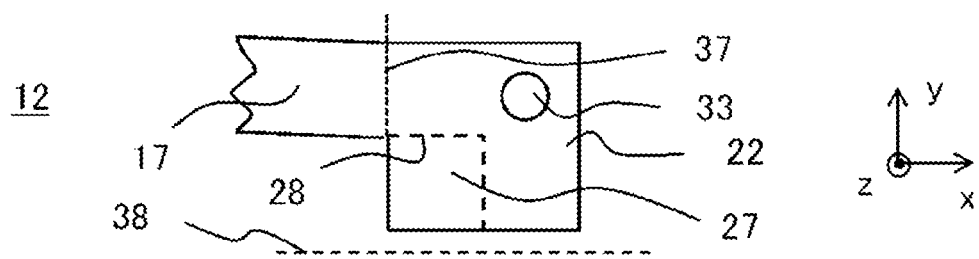
FIG. 15 is a plan view showing a main part of a rear-side stopper of FIG. 14.

Although Embodiment 3 shows an example of the positioning member 30 in which the guide part 17 connects the rear-side stopper part 15 and the front-side stopper part 16, the guide part 17 may not be connected to the front-side stopper part 16. That is, as shown in FIG. 14, the positioning member 30 may include a pair of the front-side stoppers 13, and a pair of the rear-side stoppers 12 each having the guide part 17. FIG. 14 is a diagram showing the positioning member and the carrier placement platform according to Embodiment 4, and FIG. 15 is a plan view showing a main part of the rear-side stopper of FIG. 14. In the drawings, components common to Embodiments 1, 2, and 3 are denoted by the same reference numerals and signs as those in Embodiments 1, 2, and 3.

The front-side stopper 13 is the same as the front-side stopper 13 of Embodiment 2. The rear-side stopper 12 differs from the rear-side stopper 12 of Embodiment 2 in that the rear-side stopper includes the guide part 17 on the front side (negative side in x-direction) for guiding the carrier 4 to the principal part 22 and the claw part 27. The guide part 17 is a part on the front side from a broken line 37. The principal part 22 is a part on the rear side from the broken line 37. The rear-side stopper 12 includes the principal part 22, the claw part 27, and the guide part 17 for the guide to the principal part 22 and the claw part 27. In FIG. 14, the direction from the front-side stopper 13 to the rear-side stopper 12 is the x-direction, the direction vertical to the placing face of the rear-side stopper 12 and the front-side stopper 13 on the base 3 is the z-direction, and the direction perpendicular to the x-direction and the z-direction are the y-direction. FIG. 15 shows the main part of the rear-side stopper 12 on the positive side in the y-direction. The rear-side stopper 12 on the negative side in the y-direction has a shape in which the rear-side stopper 12 on the positive side in the y-direction is inverted with respect to the broken line 38 of the x-direction. The front-side stopper 13 on the negative side in the y-direction and the front-side stopper 13 on the positive side in the y-direction are inverted in shape to each other with respect to the broken line 38 in the x-direction.

Since the rear-side stoppers 12 of the positioning member 30 and the carrier placement platform 50 of Embodiment 4 are provided with the same guide parts 17 as that of Embodiment 3, the positioning member 30 and the carrier placement platform 50 of Embodiment 4 have the same effects as those of the positioning member 30 and the carrier placement platform 50 of Embodiment 3. That is, the positioning member 30 of Embodiment 4 is designed such that the carrier 4 is tilted to the rear side without fail when the carrier 4 is placed on the base 3 or when the carrier 4 is moved from the base 3, and is provided with the rear-side stoppers 12 and the front-side stoppers 13 which restrict the carrier 4 not to move in the front-rear direction (x-direction) and the lateral direction (y-direction), the rear-side stoppers including the principal parts 22 formed with the recessed portions 28 and the front-side stoppers including the recessed portions 29. Further, the rear-side stoppers 12 include the claw parts 27 to restrict the separation of the carrier 4 from the base 3. Therefore, in the positioning member 30 of Embodiment 4, when the carrier 4 is moved from the base 3, the carrier 4 is not displaced laterally, the carrier 4 is not tilted to the front side by mistake, and the plate-shaped loads (wafers 5) can be prevented from slipping off from the carrier 4. Furthermore, in the positioning member 30 of Embodiment 4, since the rear-side stoppers 12 are provided with the guide parts 17 for guiding the carrier 4 to the recessed portions 28 and the claw parts 27, the positioning of the carrier with respect the principal parts 22 and the claw parts 27 is ensured when the carrier 4 is placed on the base 3, and the collision of the principal part 22 and the claw part 27 with the wafer 5 on the side of the side plate 41 can be prevented.

The carrier placement platform 50 of Embodiment 4 is designed such that the carrier 4 is tilted to the rear side without fail when the carrier 4 is placed on the base 3 or when the carrier 4 is moved from the base 3, and is provided with the rear-side stoppers 12 and the front-side stoppers 13 that restrict the carrier 4 not to move in the front-rear direction (x-direction) and the lateral direction (y-direction), the rear-side stoppers including the principal parts 22 formed with the recessed portions 28 and the front-side stoppers including the recessed portions 29. Further, the rear-side stoppers 12 include the claw parts 27 to restrict the separation of the carrier 4 from the base 3. Therefore, in the carrier placement platform 50 of Embodiment 4, when the carrier 4 is moved from the base 3, the carrier 4 is not displaced laterally, the carrier 4 is not tilted to the front side by mistake, and the plate-shaped loads (wafers 5) can be prevented from slipping off from the carrier 4. Furthermore, in the carrier placement platform 50 of Embodiment 4, since the rear-side stoppers 12 are provided with the guide parts 17 for guiding the carrier 4 to the recessed portions 28 and the claw parts 27, the positioning of the carrier with respect the principal parts 22 and the claw parts 27 is ensured when the carrier 4 is placed on the base 3, and the collision of the principal part 22 and the claw part 27 with the wafer 5 on the side of the side plate 41 can be prevented.

Note that, although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: rear-side stopper, 2: front-side stopper, 3: base, 4: carrier, 5: wafer (plate-shaped load), 6: foot part (plate-shaped end part), 7: opening edge part, 12: rear-side stopper, 13: front-side stopper, 15: rear-side stopper part, 16: front-side stopper part, 17: guide part, 22: principal part, 25, 27: claw part, 28, 29: recessed portion, 30: positioning member, 31*a*, 31*b*: support member, 45: opening, 50: carrier placement platform

The invention claimed is:

1. A carrier positioning member that is fixed to a base and that positions, on the base, a carrier storing a plurality of plate-shaped loads such that front faces or rear faces thereof face the base, the carrier positioning member comprising:
two front-side stoppers that come into contact with two opening edge parts being end parts of an opening of the carrier to restrict movement of the carrier to a front side; and
two rear-side stoppers that come into contact with two plate-shaped end parts formed on a rear side in the carrier to restrict movement of the carrier to the rear side and movement in a direction vertical to the base, wherein
the positioning member is fixed without moving to the base when the carrier is placed on the base or when the carrier is moved from the base, and
the front side is a side in the opening of the carrier in which the plate-shaped loads are taken in and out, and the rear side is a side opposite to the opening of the carrier.

2. The carrier positioning member according to claim 1, wherein the rear-side stoppers comprise principal parts to restrict movement of the plate-shaped end parts of the carrier to the rear side, and claw parts to restrict movement of the plate-shaped end parts in the direction vertical to the base.

3. The carrier positioning member according to claim 1, wherein the rear-side stoppers comprise:
principal parts to restrict movement of the plate-shaped end parts of the carrier to the rear side, the principal parts including recessed portions formed to restrict movement of the plate-shaped end parts to an outer side of the carrier in a lateral direction that is horizontal to the base and perpendicular to a direction of the front side; and
claw parts to restrict movement of the plate-shaped end parts in the direction vertical to the base.

4. The carrier positioning member according to claim 3, wherein the rear-side stoppers comprise guide parts that are connected to the principal parts and guide the plate-shaped end parts of the carrier to the recessed portions.

5. The carrier positioning member according to claim 1, wherein the front-side stoppers comprise recessed portions to restrict movement of the opening edge parts of the carrier to the front side and movement of the opening edge parts to an outer side of the carrier in a lateral direction that is horizontal to the base and perpendicular to the direction of the front side.

6. A carrier positioning member that is fixed to a base and that positions, on the base, a carrier storing a plurality of plate-shaped loads such that front faces or rear faces thereof face the base, the carrier positioning member comprising:
a first support member including a first front-side stopper part that comes into contact with a first opening edge part being one end of an opening of the carrier to restrict movement of the carrier to a front side, a first rear-side stopper part that comes into contact with a first plate-shaped end part formed on a rear side in the carrier to restrict movement of the carrier to the rear side and movement in a direction vertical to the base, and a first guide part that connects the first front-side stopper part and the first rear-side stopper part and guides the first plate-shaped end part of the carrier to the first rear-side stopper part; and
a second support member including a second front-side stopper part that comes into contact with a second opening edge part being the other end of the opening of the carrier to restrict movement of the carrier to the front side, a second rear-side stopper part that comes into contact with a second plate-shaped end part formed on the rear side of the carrier to restrict movement of the carrier to the rear side and movement in the direction vertical to the base, and a second guide part that connects the second front-side stopper part and the second rear-side stopper part and guides the second plate-shaped end part of the carrier to the second rear-side stopper part, wherein
the front side is a side in an opening of the carrier in which the plate-shaped loads are taken in and out, and the rear side is a side opposite to the opening of the carrier.

7. The carrier positioning member according to claim 6, wherein the first rear-side stopper comprises:
a principal part to restrict movement of the first plate-shaped end part of the carrier to the rear side, the principal part including a recessed portion formed to restrict movement of the first plate-shaped end part to an outer side of the carrier in a lateral direction that is horizontal to the base and perpendicular to a direction of the front side; and a claw part to restrict movement of the first plate-shaped end part in the direction vertical to the base, and the second rear-side stopper comprises:

a principal part to restrict movement of the second plate-shaped end part of the carrier to the rear side, the principal part including recessed portion formed to restrict movement of the second plate-shaped end part to the outer side of the carrier in the lateral direction that is horizontal to the base and perpendicular to the direction of the front side; and a claw part to restrict movement of the second plate-shaped end part in the direction vertical to the base.

8. The carrier positioning member according to claim 6, wherein the first front-side stopper comprises a recessed portion to restrict movement of the first opening edge part to the front side and movement of the first opening edge part to the outer side of the carrier in the lateral direction that is horizontal to the base and perpendicular to the direction of the front side, and the second front-side stopper comprises a recessed portion to restrict movement of the second opening edge part to the front side and movement of the second opening edge part to the outer side of the carrier in the lateral direction that is horizontal to the base and perpendicular to the direction of the front side.

9. A carrier placement platform comprising:
the base; and
the carrier positioning member fixed to the base, according to claim 1.

10. The carrier positioning member according to claim 2, wherein the front-side stoppers comprise recessed portions to restrict movement of the opening edge parts of the carrier to the front side and movement of the opening edge parts to an outer side of the carrier in a lateral direction that is horizontal to the base and perpendicular to the direction of the front side.

11. The carrier positioning member according to claim 3, wherein the front-side stoppers comprise recessed portions to restrict movement of the opening edge parts of the carrier to the front side and movement of the opening edge parts to an outer side of the carrier in a lateral direction that is horizontal to the base and perpendicular to the direction of the front side.

12. The carrier positioning member according to claim 4, wherein the front-side stoppers comprise recessed portions to restrict movement of the opening edge parts of the carrier to the front side and movement of the opening edge parts to an outer side of the carrier in a lateral direction that is horizontal to the base and perpendicular to the direction of the front side.

13. The carrier positioning member according to claim 7, wherein the first front-side stopper comprises a recessed portion to restrict movement of the first opening edge part to the front side and movement of the first opening edge part to the outer side of the carrier in the lateral direction that is horizontal to the base and perpendicular to the direction of the front side, and the second front-side stopper comprises a recessed portion to restrict movement of the second opening edge part to the front side and movement of the second opening edge part to the outer side of the carrier in the lateral direction that is horizontal to the base and perpendicular to the direction of the front side.

14. A carrier placement platform comprising:
the base; and
the carrier positioning member fixed to the base, according to claim 2.

15. A carrier placement platform comprising:
the base; and
the carrier positioning member fixed to the base, according to claim 3.

16. A carrier placement platform comprising:
the base; and
the carrier positioning member fixed to the base, according to claim 4.

17. A carrier placement platform comprising:
the base; and
the carrier positioning member fixed to the base, according to claim 5.

18. A carrier placement platform comprising:
the base; and
the carrier positioning member fixed to the base, according to claim 6.

19. A carrier placement platform comprising:
the base; and
the carrier positioning member fixed to the base, according to claim 7.

20. A carrier placement platform comprising:
the base; and
the carrier positioning member fixed to the base, according to claim 8.

* * * * *